United States Patent [19]

Levine

[11] Patent Number: 4,524,450
[45] Date of Patent: Jun. 18, 1985

[54] AUTOMATIC ADJUSTMENT OF THE AMPLITUDES OF PLURAL-PHASE CCD CLOCKING VOLTAGES

[75] Inventor: Peter A. Levine, West Windsor, N.J.

[73] Assignee: RCA Corporation, Princeton, N.J.

[21] Appl. No.: 426,097

[22] Filed: Sep. 28, 1982

[51] Int. Cl.³ .............................................. G11C 19/28
[52] U.S. Cl. ..................................... 377/62; 307/304; 357/24; 377/63
[58] Field of Search .................... 307/444, 296 R, 304; 357/24 M; 377/58, 62, 63

[56] References Cited

U.S. PATENT DOCUMENTS

| | | | |
|---|---|---|---|
| 4,138,666 | 2/1979 | Eichelberger et al. | 377/58 X |
| 4,180,807 | 12/1979 | Eichelberger et al. | 377/58 X |
| 4,206,372 | 6/1980 | Levine | 377/58 |
| 4,223,234 | 9/1980 | Levine | 377/63 |
| 4,285,000 | 8/1981 | Deyhimy et al. | 377/63 X |

FOREIGN PATENT DOCUMENTS

2070855 9/1981 United Kingdom ............. 357/24 M

OTHER PUBLICATIONS

Kent, "Charge Distribution in Buried-Channel Charge-Coupled Devices" Bell System Tech. Journal, vol. 52, No. 6, Jul.-Aug., 1973, pp. 1009-1025.

*Primary Examiner*—Stanley D. Miller
*Assistant Examiner*—D. R. Hudspeth
*Attorney, Agent, or Firm*—Joseph S. Tripoli; George E. Haas; Allen LeRoy Limberg

[57] ABSTRACT

In a plural-level gate metallization CCD shift register the clocking voltages applied to the levels are automatically supplied differential offset biases to cause the potential wells to have uniform depth. The differential offset biases are developed responsive to the differences in the threshold voltages of insulated-gate field effect transistors integrated on the same semiconductor substrate as the CCD shift register so as to have their gate electrodes in the different levels of gate metallization.

3 Claims, 6 Drawing Figures

AUTOMATIC ADJUSTMENT OF THE AMPLITUDES OF PLURAL-PHASE CCD CLOCKING VOLTAGES

The present invention relates to the adjustment of the respective amplitudes of the plural-phase clocking voltages applied to gate electrode structures of charge coupled devices (CCD's) formed in separate levels.

The invention will be described with particular reference to three-phase, three-level-polysilicon buried-channel CCD imagers; however, it is to be appreciated that it is equally applicable to CCD imagers operated with gate electrode structures formed in plural metalization levels, no matter the number of clocking phases used, and can be applied to surface-channel CCD's.

In the imagers chosen by way of example, each clocking phase is associated with gate electrodes in a different level of polysilicon. The maximum depth $V_{mb}$ of the potential well (in negative volts) with respect to bulk potential as one penetrates the top surface of the semiconductor substrate of a CCD in a normal direction, as a function of applied gate potential, $V_G$, differs for each level. Were the three phases of gate electrode structures equal in length, in a buried-channel device the potential well would be deepest for the last deposited polysilicon level and shallowest for the first deposited polysilicon level. These differences arise because the substrate is consumed during the growth of the oxides used for insulating the gate electrode structures. While nitriding can reduce these differences, it undesirably tends to raise the level of dark currents in the imager. The three phases of clocking voltage must be differentially biased, to achieve maximum transfer efficiency with the lowest possible transfer pulse amplitudes. This is desirable from the standpoint of reducing gate driver power dissipation insofar as possible, which is of increasing concern at higher clocking rates (e.g. those associated with the read-out line register, or C register, of a field transfer type of CCD imager). In the past this differential biasing has been provided for by a manual set-up procedure, and avoiding the need for such a manual set-up procedure is an underlying reason for using the present invention.

In the present invention the differences in the threshold voltages of field effect transistors integrally constructed with the CCD imager, with respective gate electrodes structure in each of the levels of metalization, are used to determine the differential bias voltages to be applied to the various levels of metalization as they are utilized in the gate electrodes of a CCD structure.

Figure 3:
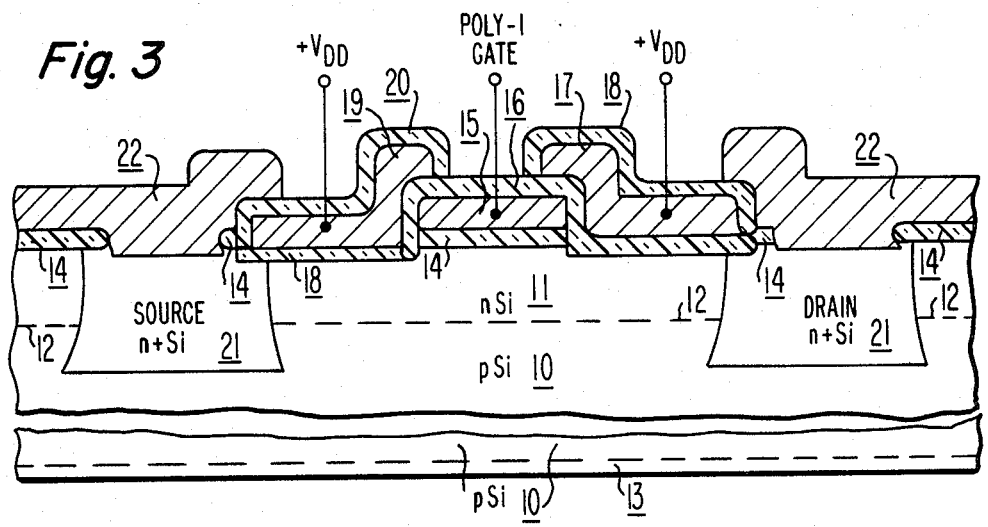
Figure 4:
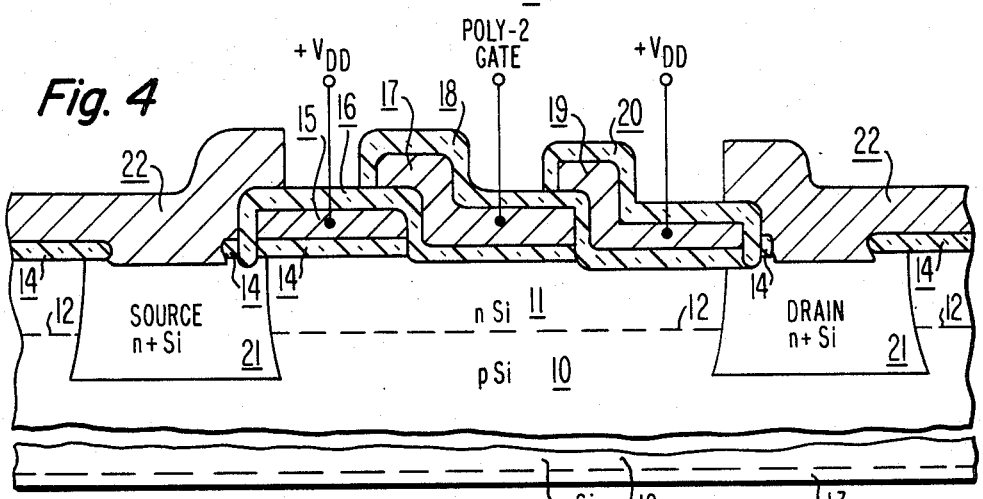
Figure 5:
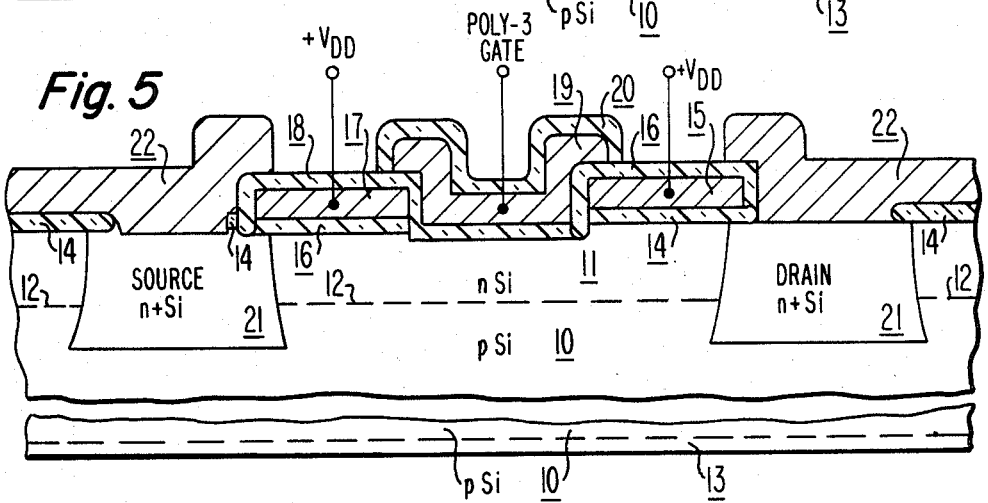
Figure 6:
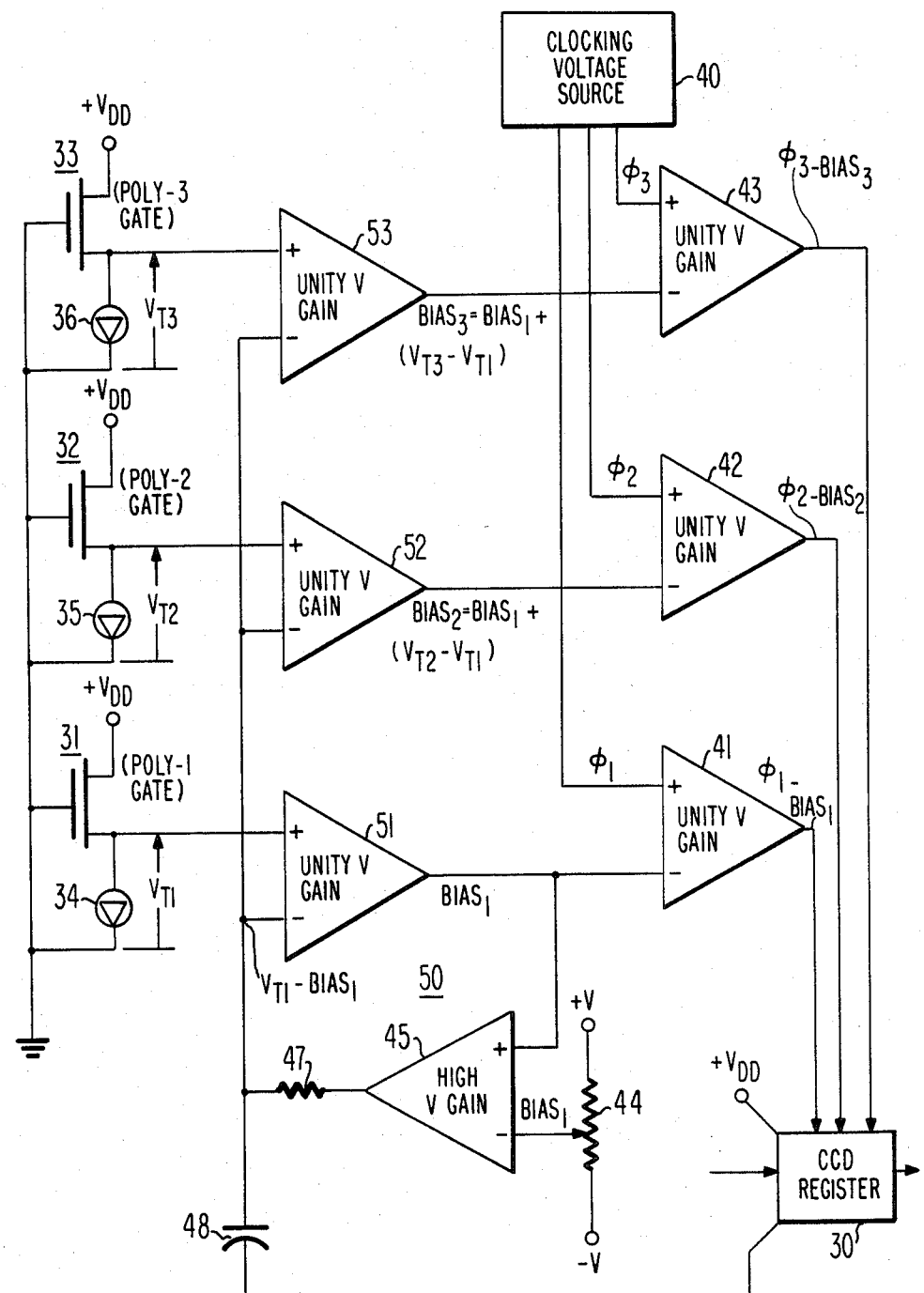

FIGS. 3, 4 and 5 are profiles of three field effect transistors included on the same semiconductor substrate as the CCD imager, for generating threshold voltage offsets for implementing the present invention; and FIG. 6 is a schematic diagram of the FIGS. 3, 4 and 5 transistors in source follower configurations followed by representative circuitry for differentially biasing the various phases of charge transfer structure clocking responsive to the threshold voltage offsets, in accordance with the present invention.

Figure 1:
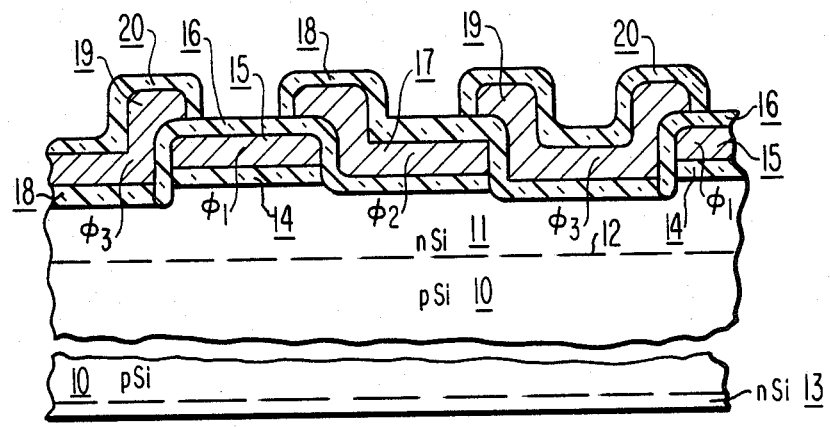
FIG. 1 is a profile of a prior art triple polysilicon gate structure taken at a cross-section through a charge transfer channel, in a CCD imager C register, for example.

FIG. 1 is a profile sketch, with vertical scale greatly exaggerated relative to horizontal scale, of a cross-section through a CCD shift register of typical triple-polysilicon construction. Representative forms of such construction were described by W. J. Bertram et al in their paper "A Three-Level Metalization Three-Phase CCD" in *IEEE TRANSACTIONS ON ELECTRON DEVICES,* Vol ED-21, No. 12, December, 1974, pp. 758-767, and by C. H. Sequin et al in their paper "Charge-Coupled Area Image Sensor Using Three Levels of Polysilicon" in the preceding Vol ED-21-No 11, November, 1974, pp. 712-720. The shift register may be considered to be a portion of the line read-out, or C, register of a CCD imager of field transfer type, by way of example. The C register is clocked at higher rate than the other registers in a field transfer type of CCD imager, and the problems of transferring charge as completely as possible and of reducing power consumption tend to be more severe because of the high clocking rate. It has been found that the biasing levels of the various clocking voltages for the C register must be adjusted to accuracies of about one-tenth volt as compared to accuracies of a volt or so in the image, or A, and field storage, or B, registers. This, for clocking voltages that establish potential wells about ten volts deep.

The register is constructed on a p-type silicon substrate which has n-type doping introduced into its top (or "front") surface to leave a p-type region 10 overlaid with an n-type region 11 to form a semiconductor junction. This junction in operation is reverse-biased to form the interface 12 defining the top of the buried channel along which charge transfer takes place. Cross-hatching is omitted from the silicon substrate regions in FIGS. 1, 3, 4, and 5 in order to simplify their appearance. Source, drain, blooming drain, and channel stop diffusions and deep diffusions to contact portions 10, and 11 of the substrate are made using conventional photolithographic processes and may be facilitated by ion implantation; these conventional features do not appear in FIG. 1.

The triple-polysilicon process used to form the register gates is of interest insofar as the reasons for the present invention are concerned. A gate oxide layer, portions 14 of which remain in the completed device is thermally grown on the top surface of the silicon substrate. A first polysilicon (poly-1) layer, portions 15 of which remain in the completed device serving as first-phase ($\phi_1$) electrode structures of the register, is deposited, is doped to make it conductive and capable of being chemically contacted by aluminum interconnects, and has an oxide layer grown over it. This oxide is used as the etch mask in the photo-etching process that defines the poly-1 gate electrodes and is etched away together with the first grown gate oxide not under the $\phi_1$ gate electrode structures. A second gate oxide, portions 16 of which overlying the $\phi_1$ and underlying the $\phi_2$ gate electrode structures remain in the completed device, is then grown. The second polysilicon (poly-2) layer is deposited, doped, steam-oxidized to form an oxide layer for use as an etch mask, and photo-etched to define the second-phase ($\phi_2$) electrode structures of the register, among the remaining portions 17 of poly-2 layer. The etch mask oxide and the portions of the second gate oxide over the $\phi_1$ gate electrode structures and where the $\phi_3$ gate electrodes structures are to be are removed as the final step in this photo-etching procedure. The third gate oxide is grown, portions 18 of which remain in the completed device over the $\phi_2$ gate electrode structures and under the $\phi_3$ gate electrode structures. A third polysilicon (poly-3) layer, portions 19 of which remain in the completed device and serve as third-phase ($\phi_3$) gate electrode structures in the register, is then deposited, doped, steam-oxidized to form an oxide layer for use as an etch mask, and photo-etched to define the $\phi_3$ gate electrode structures. The etch mask oxide and the portions of the third gate oxide are removed in the final step of the photo-etching procedure, and a cap oxide 20 is grown over the exposed remaining portions 19 of the poly-3.

The formation of the CCD gate electrode structures may be followed by thinning the wafer to ten microns or so thickness by etching, assuming the CCD imager is to be back-illuminated, and it may also be desired to diffuse a graded p-diffusion 13 into the new surface to generate a drift field normal to that surface for repelling charge carriers generated in the bulk, so they are not so likely to be subject to surface recombination.

In a preferred construction, a glass backing plate may then be cemented to this new back surface with a transparent cement. The high-temperature processing being completed, there follows the standard steps of opening contact holes to the source, drain, blooming drain and deep diffusions in the silicon substrate; evaporating an aluminum layer on the top surface and photo-etching it to define aluminum interconnects and bond pads, dicing; bonding and packaging.

Figure 2:
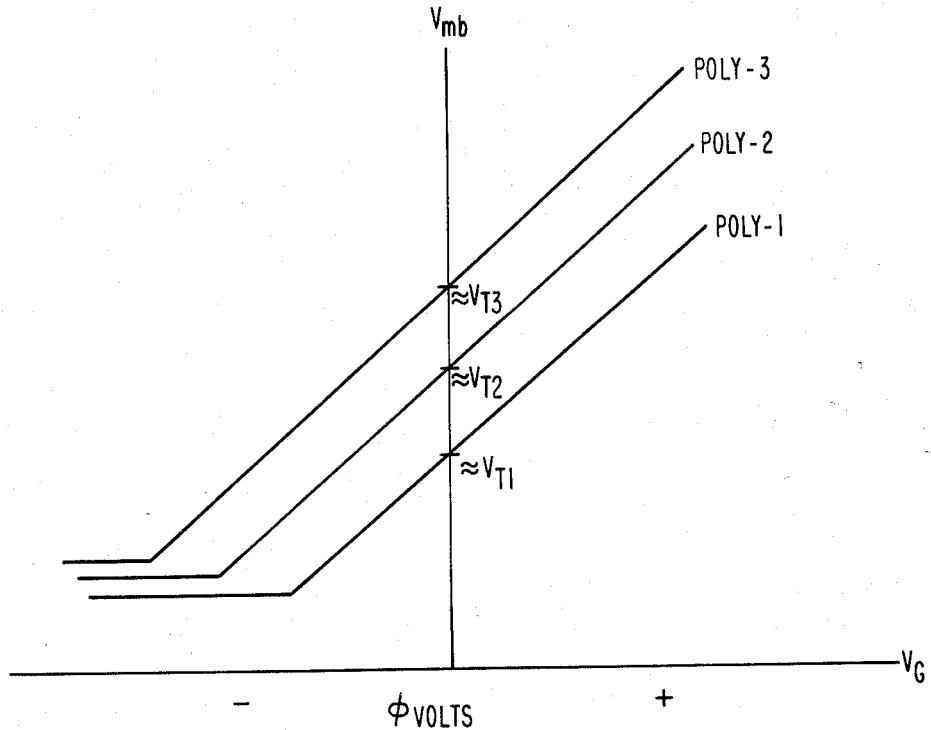
FIG. 2 is a graph of $V_{mb}$ versus gate voltage for gate electrode structures in each of the three levels of polysilicon in the FIG. 1 charge transfer structure.

As seen from FIG. 2 the $V_{mb}$-versus-gate-potential-$V_g$ characteristics the $V_{mb}$ associated with the $\phi_1$, $\phi_2$ and $\phi_3$ gate electrode structures made by the proceding or similar three-level metallization processes differ appreciably. This variation of $V_{mb}$ for gate electrodes in different levels of metallization is generally characteristic of any CCD structure using plural-level metallization. A primary source of this difference is that the $\phi_1$, $\phi_2$ and $\phi_3$ gate electrode structures tend to be at different distances from interface 12, owing to the etching through earlier gate oxides into the silicon substrate before the later gate oxides are grown.

The following method can be used for measuring $V_{mb}$, the maximum well depth, under a gate electrode of a CCD shift register for any given gate potential, $V_G$. All of the gate electrodes of the register except the one of interest are biased to deplete the semiconductor substrate under them and provide virtual source and drain immediately flanking the gate electrode of interest. That is, the shift register is operated essentially as a single-gate field effect transistor. The gate electrode of interest is biased to the gate potential level $V_G$ of interest, measured with reference to the reference potential biasing the semiconductor substrate bulk. The drain region is connected to drain potential by a device sensing the onset of drain current flow, and potential applied to the source region is changed, from a value where no current is injected from the source region to flow to the drain region across the floor of the potential well induced under the gate electrode of interest, to a value where such current is so injected. The value of source potential where transition to drain current flow occurs is essentially the well depth. There is a small error due to a barrier height between the very deep potential well in the highly depleted region under the gate electrode preceeding the gate electrode on the source side and the potential well in the less depleted region under the gate.

Operating the CCD shift register as a single-gate field effect transistor, the transistor characteristics insofar as drain current versus source-to-gate voltage are concerned should not be different for the case where the drain current flows responsive to applied source-to-gate voltage than it would be for the case where the drain current flows responsive to applied source current. So one may apply a threshold value of source current to the CCD shift register operated as a transistor to cause it to respond with the source-to-gate potential offset associated with the flow of the corresponding threshold value of drain current. This source-to-gate potential is still intimately associated with maximum well depth. The $V_{mb}$'s of the various gate electrodes at zero $V_G$ are, then, substantially equal to the threshold voltages $V_{T1}$, $V_{T2}$ and $V_{T3}$ of insulated gate field effect transistors having gate electrodes in the poly-1, poly-2 and poly-3 levels.

Any small differences in maximum potential well depth $V_{mb}$ and $V_T$, due to between-gate barrier heights, will be of no consequence with regard to the present invention, which is concerned with the difference between potential well depths under gate electrodes in different levels of polysilicon. The length of the CCD register operated as an insulated-gate field effect transistor has no effect on $V_{mb}$ measurement, so long as there are gates flanking the gate of interest to reproduce fringing field effects. This allows shortened shift registers to be used as models for measurements of the $V_{mb}$'s of potential wells induced under the gate electrodes in the shift registers actually operated as shift registers, the shortened registers being located on the same integrated circuit as the operating shift registers and constructed by the same processing steps. Indeed, even the gate electrodes flanking the gate electrode of interest may be omitted in less critical designs so substantially conventional insulated field effect transistor structures are used for $V_{mb}$ measurements.

FIGS. 3, 4 and 5 show preferred structures for transistors with poly-1, poly-2 and poly-3 gate electrodes respectively. These transistors, which have depletion-mode conduction characteristics when buried-channel substrates are used, are formed for the most part by the same processing steps used to make the FIG. 1 register, as will be self-evident in FIGS. 3, 4 and 5 from the identification numerals corresponding to those of FIG. 1 and from the general resemblance of the disposition of gate structures relative to the top surface of the silicon substrate. An n+ diffusion 21 into selected regions of the silicon substrate prior to gate electrode structure fabrication defines a respective source region on the left-hand side of each of the FIGS. 3, 4 and 5 field effect transistors and a respective drain region on its right-hand side. Aluminization 22 ohmically contacts these source and drain regions and is etched to provide interconnects to them in what is in effect fourth-layer metallization. The poly-1 gate of the FIG. 3 FET the poly-2 gate of the FIG. 4 FET, and the poly-3 gate of the FIG. 5 FET are used in generating the $V_T$'s of interest. Each is flanked by gates in the other polysilicon levels. These other gates are biased to strongly deplete the silicon substrate beneath them, extending virtual source and drain regions to the gate inducing the channel with $V_T$ of interest. This structure guarantees that the lengths of the FET channels corresponds to the lengths under the corresponding gate electrode structures of the CCD register. The width of these transistors normal to the profile can be defined by channel stops to be the same as the width of the charge transfer channel in the FIG. 1.

FIG. 6 shows three-phase CCD shift register 30 and FET's 31, 32 and 33, which are of integrated construction on the same semiconductor substrate. CCD shift register 30 has an optical or electrical input and an electrical output, and is to be supplied clocking voltages $\phi_1$, $\phi_2$ and $\phi_3$ with which bias offsets BIAS$_1$, BIAS$_2$ and BIAS$_3$ have been respectively combined to assure minimum power consumption in the shift register operation consonant with optimum charge transfer efficiency. FET's 31, 32 and 33 are arranged for source-follower operation, with their drains connected to $+V_{DD}$ voltage supply. The poly-1 gate of FET 31, the poly-2 gate of FET 32 and the poly-3 gate of FET 33 are connected to a common reference potential (their flanking gates connected to $+V_{DD}$ not being shown here). The sources of FET's 31, 32 and 33 are biased by current sources 34, 35 and 36, respectively, to the low value of source current flow associated with $V_{T1}$, $V_{T2}$ and $V_{T3}$ threshold voltages between their respective gate and source electrodes. Current sources 34, 35 and 36 conveniently comprise self-biased depletion-mode FET's like 31, 32 or 33 integrated with them and shift register 30.

Three-phase clocking voltages $\phi_1$, $\phi_2$, $\phi_3$ without adjusted bias offsets are supplied from clocking voltage source 40 to the non-inverting input connections of differential-input operational amplifiers 41, 42 and 43 the respective outputs of which are to supply three-phase clocking voltages with adjusted bias offsets BIAS$_1$, BIAS$_2$ and BIAS$_3$ to CCD shift register 30, at least at selected times. BIAS$_1$ voltage can be a single operator-adjustable voltage, as shown, and the BIAS$_2$ and BIAS$_3$ voltages can be automatically determined from it in accordance with the invention. In less critical applications BIAS, voltage may be a fixed-value voltage. BIAS$_1$, BIAS$_2$ and BIAS$_3$ are supplied to the inverting input connections of differential-input voltage-follower amplifiers 41, 42 and 43 respectively to cause $\phi_1$-BIAS$_1$, $\phi_2$-BIAS$_2$ and $\phi_3$-BIAS$_3$ clocking voltages to be supplied from their respective output connections to register 30.

The operator-adjustable voltage is shown as being the tap voltage from a potentiometric voltage divider 44, allowing adjustment from a voltage $-V$, negative respective to CCD imager substrate, to a voltage $+V$, positive respective to CCD imager substrate. It is applied to the inverting input connection of a differential-input operational amplifier 45 connected in a degenerative voltage-feedback loop 50 with a low-pass filter 46 (comprising, for example, a series resistor 47 and integrator capacitor 48) and an inverting amplifier. This inverting amplifier is provided between inverting-input and output connections of a differential-input voltage-follower amplifier 51, with non-inverting input connection to the source electrode of FET 31 to receive $V_{T1}$. The high voltage gains around degenerative feedback loop 50 and in operational amplifier 45 causes the loop to adjust its output voltage, supplied from the output connection of operational amplifier 51 to the inverting input connection of voltage-follower amplifier 41, to have a value BIAS$_1$ equal to the operator-adjustable voltage supplied to the non-inverting input connection of amplifier 45. This, so the error voltage between the non-inverting and inverting input connections of amplifier 45 is made negligibly small and the negative feedback loop can be in equilibrium.

The error voltage between the non-inverting and inverting input connections of differential-input voltage-follower amplifier 51 has to have a value BIAS 1 for the degenerative voltage-feedback loop 50 to be in equilibrium. Since $V_{T1}$ is applied to the non-inverting input connection of high-voltage gain operational amplifier 51 from the source-follower connection of FET 31, the inverting input connection of amplifier 51 is maintained at a potential substantially equal to $V_{T1}$-BIAS$_1$ by the feedback loop 50. This potential is applied to the inverting input connections of amplifiers 52 and 53.

Differential-input voltage-follower amplifier 52 responds, to $V_{T1}$-BIAS$_1$ applied to its inverting input connection, and to $V_{T2}$ supplied to its non-inverting input connection from the source electrode of source-follower FET 32, to supply an offset bias potential BIAS$_2$=BIAS$_1$+($V_{T2}$−$V_{T1}$) from its output connection to the inverting input connection of amplifier 42. Differential-input voltage-follower amplifier 53 responds, to $V_{T1}$-BIAS$_1$ applied to its inverting input connection, and to $V_{T3}$ supplied to its non-inverting input connection from the source electrode of source-follower FET 33, to supply an offset bias potential BIAS$_3$=BIAS$_1$+($V_{T3}$−$V_{T1}$) from its output connection to the input connection of amplifier 43. The ($V_{T2}$−$V_{T1}$) and ($V_{T3}$−$V_{T1}$) voltages can be referred to generally as $\Delta V_{mb}$ voltages since they describe differences in maximum potential well depths.

In a CCD imager of the field transfer type with an image (or A) register, a field store (or B) register and a read-out line (or C) register, these various shift registers may have differing length and width gate electrodes. It is inconvenient to integrate nine $V_{mb}$-measuring devices on the same semiconductor substrate and to replicate the derivation of clock phase bias adjustments for all three register clocks. Where the gate electrodes of each register are uniform in length, even though they differ from register to register, the $\Delta V_{mb}$ compensation voltages for the higher rate C-register clocking voltages can be derived and used for the slower and thus less critical A-register and B-register clocking voltages, so only three $V_{mb}$ measuring "transistors" need be integrated.

In imagers with three-phase A-register clocking the gate electrodes for one phasing may be twice as long as those for the other phasings and in such case it is desirable to use four $V_{mb}$ measuring transistors, one having a double-length gate over a C-register-width charge transfer path.

What is claimed is:
1. In combination:
   a charge-coupled-device shift register with plural-phase clocking of sets of gate electrodes, each set in a respective successive layer of conductive material deposited over an intervening insulating layer on the surface of a semiconductor substrate;
   a plurality of insulated-gate field effect transistors on the surface of the semiconductor substrate, each having a source electrode and a drain electrode, defining the ends of its conduction channel, and each having a respective gate electrode in a different one of said levels of conductive material;
   biasing means connecting each of said field effect transistors, for causing each to have a prescribed level of current flow through its conduction channel, for establishing a respective offset voltage between its source and gate electrodes; and means for generating, at least at selected times, differentially-biased clocking voltages in respective phases, for application to respective ones of said sets of gate electrodes, including means for generating during said at least selected times clocking voltages in those phases which are uniformly biased, including means for combining with each except a selected one of said phases of uniformly biased clocking voltages the difference between the offset voltage associated with the field effect transistor having its gate electrode in the layer of conductive material to which the selected phase of clocking voltage is applied and the offset voltage associated with the field effect transistor having its gate electrode in the layer of conductive material to which the differentially-biased clocking voltage generated by such combining is applied.

2. A combination as set forth in claim 1 wherein said semiconductor substrate is monocrystalline silicon, said conductive material is polycrystalline silicon and said insulating layer is silicon dioxide.

3. In a charge-coupled device (CCD) operated by N-phase clock voltages, each phase connected to a different set of gate electrodes, and where each set of gate electrodes may have a different potential well depth versus gate-voltage-to-substrate-voltage characteristic, an arrangement for compensating for said differences comprising, in combination:

N field-effect transistors on the same substrate as said CCD, each transistor having a gate electrode insulated from the substrate and having source and drain electrodes in the substrate defining ends of the conduction channel of the transistor, the N gate electrodes of said field effect transistors having the same lengths and spacings from the substrate as the N sets of gate electrodes, respectively, of said CCD;

means for applying N bias currents of similar value to the conduction channels of said N field effect transistors, respectively, to cause said N field effect transistors to exhibit N offset voltages between their respective source and gate electrodes; and means responsive to said N offset voltages for modifying said N phases of said clock voltages, respectively, in a sense to equalize the respective potential well depth versus gate-voltage-to-substrate-voltage characteristics, where N is an integer greater than one.

* * * * *